(12) United States Patent
Shoa Hassani Lashdan

(10) Patent No.: US 8,754,792 B2
(45) Date of Patent: Jun. 17, 2014

(54) SYSTEM AND METHOD FOR FIXED RATE ENTROPY CODED SCALAR QUANTIZATION

(75) Inventor: Alireza Shoa Hassani Lashdan, Burlington (CA)

(73) Assignee: Sigma Designs, Inc., Milpitas, CA (US)

( * ) Notice: Subject to any disclaimer, the term of this patent is extended or adjusted under 35 U.S.C. 154(b) by 97 days.

(21) Appl. No.: 13/602,194

(22) Filed: Sep. 2, 2012

(65) Prior Publication Data

US 2014/0015698 A1 Jan. 16, 2014

Related U.S. Application Data

(60) Provisional application No. 61/671,684, filed on Jul. 14, 2012.

(51) Int. Cl.
*H03M 7/40* (2006.01)
*H03M 7/30* (2006.01)

(52) U.S. Cl.
CPC .......... *H03M 7/3093* (2013.01); *H03M 7/3095* (2013.01); *H03M 7/6035* (2013.01)
USPC ................ 341/67; 341/65; 341/106; 341/107

(58) Field of Classification Search
CPC . H03M 7/3093; H03M 7/3095; H03M 7/607; H03M 7/6076
USPC ....................... 341/65, 67, 106, 107
See application file for complete search history.

(56) References Cited

U.S. PATENT DOCUMENTS

| | | | | |
|---|---|---|---|---|
| 6,014,095 A * | 1/2000 | Yokoyama | | 341/67 |
| 6,256,413 B1 * | 7/2001 | Hirabayashi | | 382/232 |
| 6,292,114 B1 * | 9/2001 | Tsai et al. | | 341/67 |
| 6,625,321 B1 * | 9/2003 | Li et al. | | 382/239 |
| 7,420,993 B2 * | 9/2008 | Tasaki | | 370/535 |
| 7,421,132 B2 * | 9/2008 | Okada | | 382/238 |
| 7,778,477 B2 * | 8/2010 | Lee et al. | | 382/246 |
| 8,004,431 B2 * | 8/2011 | Reznik | | 341/67 |
| 8,340,445 B2 * | 12/2012 | Yamaguchi et al. | | 382/238 |
| 8,565,298 B2 * | 10/2013 | Schwartz | | 375/240 |
| 2007/0016415 A1 * | 1/2007 | Thumpudi et al. | | 704/230 |
| 2010/0220936 A1 * | 9/2010 | Yamaguchi et al. | | 382/238 |
| 2010/0254463 A1 * | 10/2010 | Narroschke et al. | | 375/240.29 |
| 2011/0164678 A1 * | 7/2011 | Date et al. | | 375/240.03 |
| 2012/0219230 A1 * | 8/2012 | Sasai et al. | | 382/233 |

* cited by examiner

*Primary Examiner* — Linh Nguyen
(74) *Attorney, Agent, or Firm* — Aaron Wininger; Perkins Coie LLP

(57) ABSTRACT

A system and method combine an entropy coding algorithm like Huffman or arithmetic coding with a fixed length coding scheme and can improve the compression performance in a fixed rate compression scheme. The fixed length code assigns codes with a fixed length to symbols that have the highest probability of occurrence. Therefore, fixed length coding is used if all symbols in the sequence are from the set of symbols that have the highest probability values. Otherwise an entropy coding algorithm (e.g. Huffman coding) is used to encode quantized symbols.

2 Claims, 4 Drawing Sheets

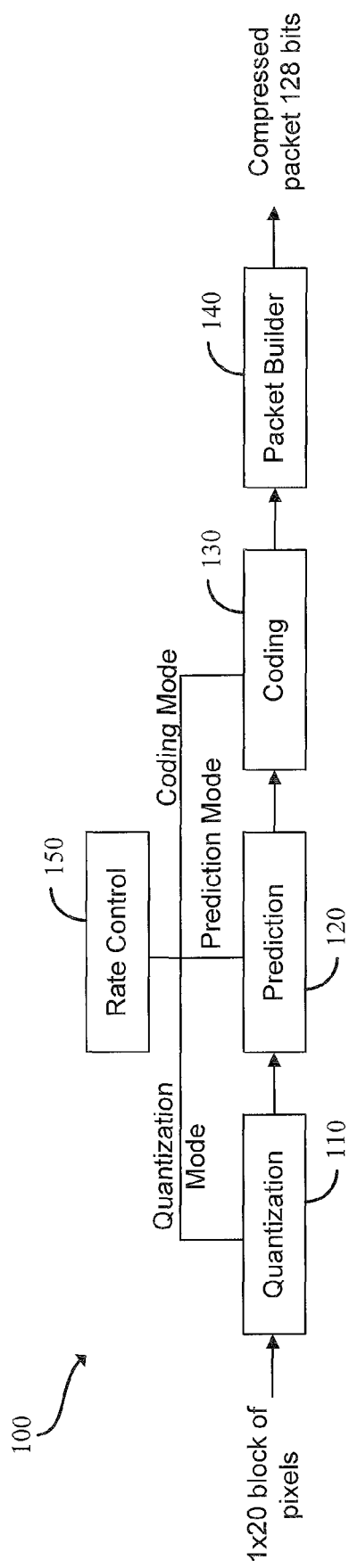
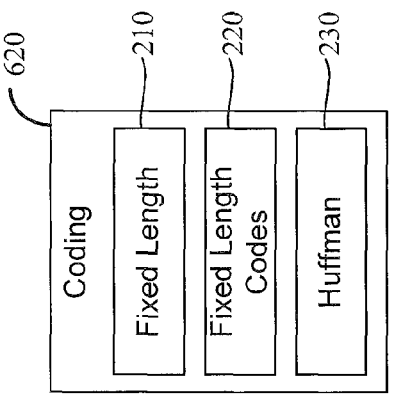
FIG. 1
FIG. 2

SYSTEM AND METHOD FOR FIXED RATE ENTROPY CODED SCALAR QUANTIZATION

PRIORITY CLAIM

This application claims benefit of and incorporates by reference U.S. Patent Application No. 61/671,684 filed Jul. 14, 2012 entitled "Coding Algorithm for Entropy Coded Scalar Quantization used in Fixed Rate Data Compression" by Alireza Shoa Hassani Lashdan.

FIELD OF THE INVENTION

At least one embodiment of the present invention pertains to image compression, and more particularly but not exclusively, to a system and method for fixed rate image compression with improved compression performance.

BACKGROUND

In fixed rate coding a block of n symbols must be encoded using r bits where r is a fixed number. The rate distortion optimal solution for this problem is to use a fixed rate vector quantization with a codebook of size $2^r$. This approach is computationally expensive and instead a fixed rate scalar quantization can be used. However, scalar quantization results in relatively poor performance. —One of the common solutions is to use entropy coded scalar quantization. In this technique symbols are quantized using a scalar quantizer and the quantized symbols are entropy coded. The quantization step size must be adjusted so that the entropy coded symbols can be coded using fewer than r bits. The resulting bits are placed in a packet that has a fixed size of r bits.

If a sequence of symbols cannot be encoded using fewer than r bits more quantization is applied and the amount of information that is sent is reduced. Therefore, the best coding algorithm maximizes the probability of encoding sequences of symbols using fewer than r bits. However entropy coding algorithms like Huffman coding or arithmetic coding minimize the average bit rate and therefore may not be optimal for fixed rate compression algorithms.

Accordingly, a new system and method are needed that improve compression performance for fixed rate compression algorithms.

SUMMARY

This summary is provided to introduce in a simplified form certain concepts that are further described in the Detailed Description below and the drawings. This summary is not intended to identify essential features of the claimed subject matter or to limit the scope of the claimed subject matter.

In an embodiment of the invention an algorithm in an encoder, computer-readable medium with instructions thereon to execute a method, and the method combines Huffman coding (or any other entropy coding technique, such as arithmetic coding, universal coding logic, or Golomb coding) with a fixed length coding scheme and can improve the compression performance in a fixed rate compression scheme. The fixed length code assigns codes with a fixed length of $$\frac{r-1}{n}$$

bits to the $$2^{\frac{r-1}{n}}$$

symbols that have the highest probability of occurrence. Therefore, fixed length coding is used if all n symbols in the sequence are from the set of $$2^{\frac{r-1}{n}}$$

symbols that have the highest probability values. Otherwise entropy coding techniques like Huffman coding is used to encode quantized symbols. One bit is used to specify if Huffman coding is used or the fixed length coding is used at the encoder. If none of the two coding algorithms can provide a bit count less than r bits the quantization step size must increase.

In an embodiment, the encoder comprises quantization logic, coding logic and a packet builder. The coding logic includes fixed length coding logic, fixed length codes, and Huffman coding logic. The quantization logic is configured to quantize a sample. The fixed length coding logic is configured to encode the quantized sample using the fixed length codes when the quantized samples all have corresponding fixed length codes. The Huffman coding logic (or other entropy coding logic) is configured to encode the quantized sample when the quantized samples do not all have corresponding fixed length codes. The packet builder, which is communicatively coupled to the coding logic, is configured to build a packet with the encoded samples.

In an embodiment, the encoder further comprises a probability distribution estimation logic, communicatively coupled to the coding logic, which is configured to determine a probability distribution of the sample and assign the fixed length codes to sample symbols according to the probability distribution In an embodiment, the method comprises: quantizing a sample; encoding the quantized sample using fixed length codes when the quantized samples all have corresponding fixed length codes, encoding the quantized sample with Huffman coding when the quantized samples do not all have corresponding fixed length codes; and building a packet with the encoded samples.

Other aspects of the encoder, medium, and method will be apparent from the accompanying figures and detailed description.

BRIEF DESCRIPTION OF THE DRAWINGS

One or more embodiments of the present invention are illustrated by way of example and not limitation in the figures of the accompanying drawings, in which like references indicate similar elements.

FIG. 1 shows an encoder according to an embodiment of the invention.

FIG. 2 shows a coding logic of the encoder.

DETAILED DESCRIPTION

References in this description to "an embodiment", "one embodiment", or the like, mean that the particular feature, function, structure or characteristic being described is included in at least one embodiment of the present invention. Occurrences of such phrases in this specification do not necessarily all refer to the same embodiment. On the other hand, such references are not necessarily mutually exclusive either.

When a compression encoder compresses any type of data it takes advantage of the probability distribution of that data and assigns codes to each data symbol based on its probability distribution. In general shorter codes are assigned to symbols with higher probability and longer codes are assigned to low probability symbols. When a large set of data is encoded since the high probability symbols occur more, the encoder uses the short codes more often and therefore achieves compression. Entropy coding techniques like Huffman coding and arithmetic coding find the optimum code lengths and code words for each symbol and they minimize the average bit rate when they are used for variable rate coding of the source. Other entropy coding techniques like universal or Golomb coding use a more structured and simpler code and they can minimize the average bit rate if the source probability distribution matches closely with the implied probability distribution of these codes. In order for the entropy coding technique to find the optimum code lengths it needs to know the probability distribution of the input source. There are different ways to determine the probability of the source. For many sources the probability distribution is derived offline or it is known and therefore a fixed probability distribution is used in the encoder. For other applications the distribution is computed dynamically during runtime based on the received samples from the input source.

Figure 6:
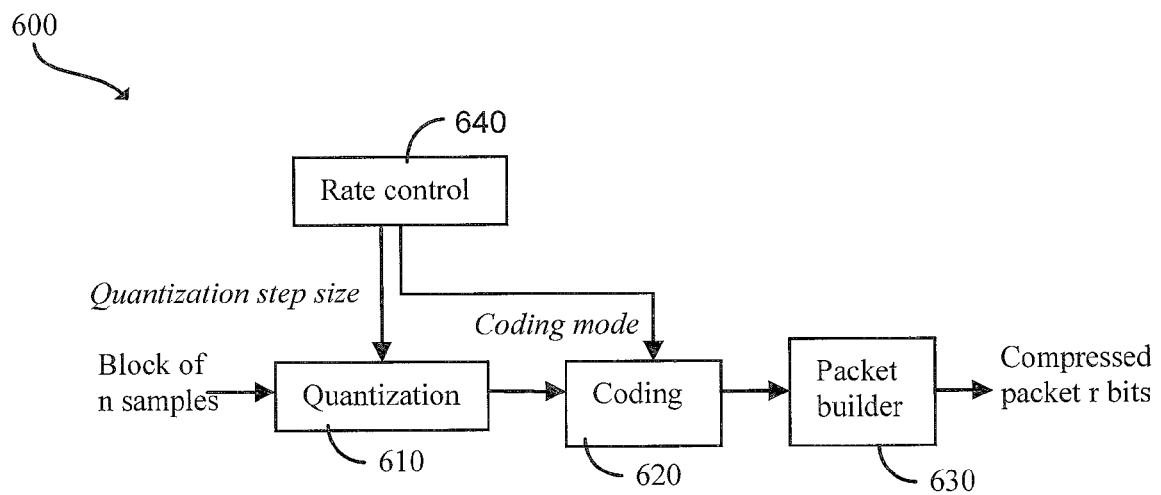
FIG. 6 show an encoder according to an embodiment of the invention.

Entropy coding techniques like Huffman, arithmetic, universal or Golomb coding result in a variable length code for the input source. For some applications a fixed rate code is required and therefore variable length coding cannot directly be used. In fixed rate encoding a block of source samples can be encoded using a fixed number of bits in order to achieve a fixed bit rate. One of the solutions to the fixed rate data encoding is to use entropy coded scalar quantization as it is used in encoder 600 shown in FIG. 6. In this technique each sample in the input block is quantized by the scalar quantization logic 610 and encoded using a variable length code by the coding logic 620. The codes for each sample are placed in a packet that can contain a fixed number of bits. This is done by the packet builder logic 630. The quantization step size must be adjusted in order to ensure that the codes for the quantized input samples can fit in the compressed packet with a fixed size. This is done by a rate control logic 640 and it can be done before the final quantization and coding. Coding will be discussed in further detail below:

FIG. 2 shows the coding logic 620 of the encoder 600. The coding logic 620 comprises fixed length coding logic 210, optionally fixed length codes 220 if probability distribution of source data is known, and an entropy coding logic like Huffman coding 230. The fixed length code assigns $$\frac{r-1}{n}$$

bits to the $$2^{\frac{r-1}{n}}$$

symbols that have the highest probability of occurrence. Therefore, fixed length coding can only be used if all n symbols in the input block are from the set of $$2^{\frac{r-1}{n}}$$

symbols that have the highest probability values. Otherwise Huffman coding (or any other entropy coding technique) is used. One bit is used to specify if Huffman or the fixed length codes are used. The encoder 600 works as follows:

Suppose a sequence of samples $\{x_0, \ldots, x_{n-1}\}$ taken from the source $A=\{a_0, \ldots, a_{m-1}\}$ must be coded using r bits using entropy coded scalar quantization. Without loss of generality one can assume symbols are sorted in the order of their probability distribution, i.e.

$$p(a_i) \geq p(a_{i+1})$$

If the probability is not known or the probability distribution changes over time, the encoder 600 and the decoder can estimate the distribution from the received samples in a same way.

Let $x_q = Q(x,q)$ be the scalar quantization output using a quantization parameter q and assume that increasing q results in more quantization.

Let $c_h(a_i)$ and $l_h(a_i)$ be the Huffman code and length for symbol $a_i$ respectively.

Let $c_f(a_i)$ be the fixed length code for symbol $x_i$. $c_f(a_i)$ is the binary representation of the index i. Each binary code has a fixed length of $$\frac{r-1}{n}.$$

If $$\frac{r-1}{n}$$

is not an integer number, the encoder 100 can assign $$\left\lceil \frac{r-1}{n} \right\rceil$$

bits to the first r−1 mod n samples in the block of size n and $$\left\lfloor \frac{r-1}{n} \right\rfloor$$

bits to the rest of the samples. For example, if 20 samples are supposed to be encoded using 128 bits the encoder 600 can assign $$\left\lceil \frac{128-1}{20} \right\rceil = 7$$

bits to the first 127 mod 20=7 samples and $$\left\lfloor \frac{128-1}{20} \right\rfloor = 6$$

bits to the other 13 samples.

In order to encode the n random variables using r bits the encoder 600 needs to find the quantization parameter and encoding technique that results in fewer than r bits in the compressed packet. Once the coding technique and quantization parameter are found the packet builder 630 will add them to the header of the compressed packet. 1 bit in the compressed packet is used to encode the coding mode and $b_q$ bits are used to encode the quantization parameter. The coding logic 620 then encodes the quantized samples and puts them in the final compressed packet. An algorithm according to an embodiment follows below. $t_k$ is defined by:

$$t_k = \begin{cases} \left\lceil \frac{r-1}{n} \right\rceil & k < r-1 \bmod n \\ \left\lfloor \frac{r-1}{n} \right\rfloor & k \geq r-1 \bmod n \end{cases}$$

```
Start
r_n = 1 + b_q
r_f = r
for k = 0 to n - 1
    x_k^q = Q(x_{k+q})
    r_n = r_n + l_n(x_k^q)
    if x_k^q ≥ a_n r_n
        r_f = r + 1
    end
end
if l_n ≤ r
    for k = 0 to n - 1
        packet[0] = 1
        packet[1:b_q] = q
        packet[b_q + 1:r - 1] = {c_n(x_k^q), ..., c_n(x_{n-1}^q)}
    end
else if l_f ≤ r
    for k = 0 to n - 1
        packet[0] = 0
        packet[1:b_q] = q
        packet[b_q + 1:r - 1] = {c_f(x_k^q), ..., c_f(x_{n-1}^q)}
    end
else
    increase q
    go to start
end
```

Figure 3A:
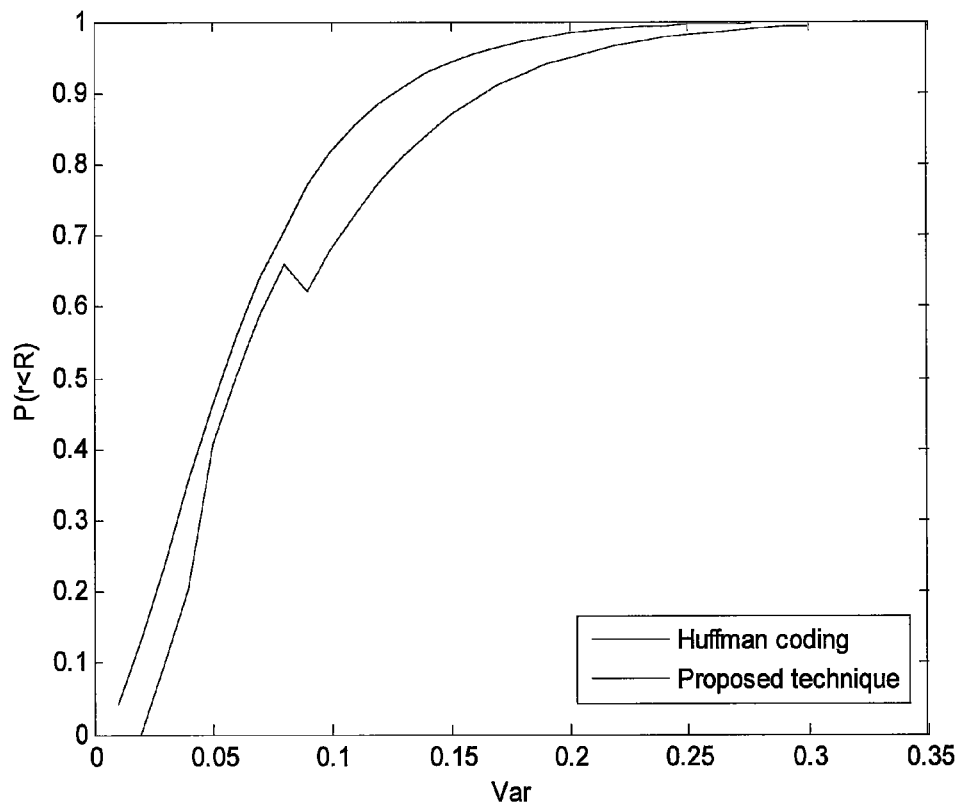
FIGS. 3A and 3B show comparisons of performance of an embodiment of the invention.
Figure 3B:
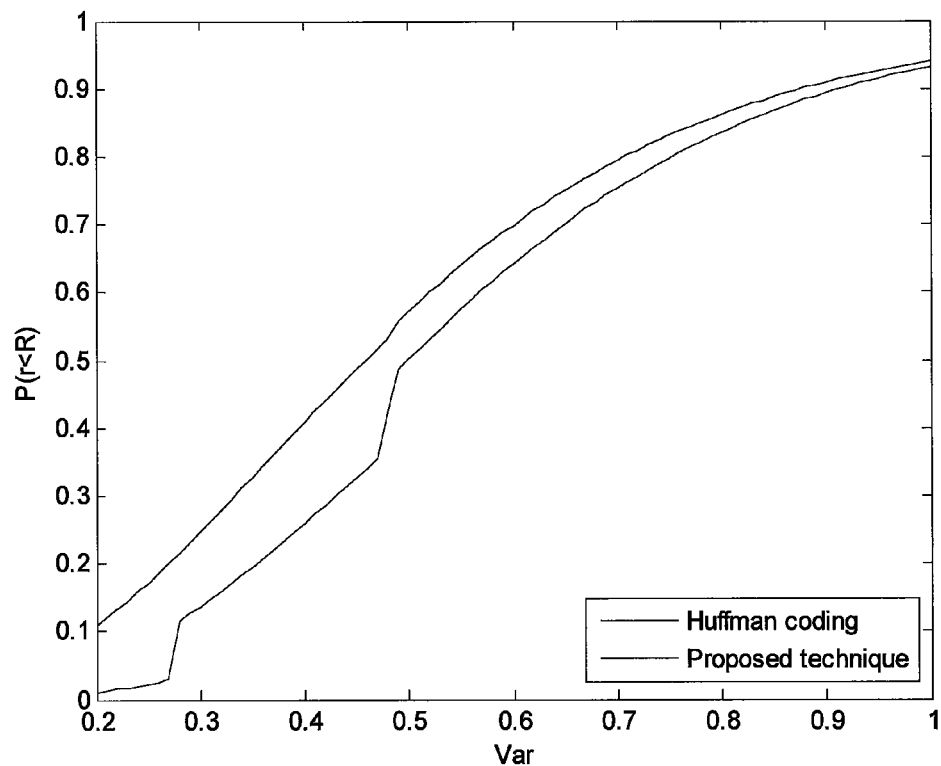

FIGS. 3A and 3B show comparisons of performance of an embodiment of the invention in which Huffman coding is combined with fixed length coding. Specifically, the embodiment is compared with only Huffman coding for Gaussian and Laplacian sources, respectively. In these figures the probability of encoding a sequence using less than r bits is calculated for Gaussian and Laplacian sources with different variances. As shown in the figure the embodiment outperforms Huffman coding for both sources and for all variances.

FIG. 1 shows an encoder 100 according to an embodiment of the invention. This encoder 100 includes an image processing application embodiment. The encoder 100 includes a quantization logic 110, communicatively coupled to a prediction logic 120, which is communicatively coupled to a code logic 130. A rate control logic 150 is communicatively coupled to the quantization logic 110, the prediction logic 120, and the coding logic 130, which is communicatively coupled to a packet builder logic 140. The rate control 150 controls quantization mode, prediction mode and coding mode for the quantization logic 110, the prediction logic 120, and the coding logic 130, respectively.

In an embodiment of this encoder 100, 20 samples from an image are compressed into packets of size 128 bits. This type of compression can be used when low latency and low complexity are required. In this encoder 100, quantization is done before prediction in order to avoid the need for a feedback loop that is necessary in conventional predictive coding based algorithms. Prediction can be the value of the previous pixel, a linear combination of the past 2 pixels or the second previous pixel. Quantization is done using a uniform scalar quantization.

$$Q(x,q) = (x + 2^{q-1}) \gg q$$

$$Q^{-1}(x_q, q) = x_q \gg q$$

The above quantization ensures that visually lossless compression can be achieved if a decompressed image is compressed multiple times. The reason for this is that during a second compression each packet can be compressed using the same quantization, prediction and entropy coding mode as the first compression. If these modes are selected by the rate control logic 150 the second quantization will result in quantization reconstructed values that are identical to the input samples for the second compression and therefore lossless performance is achieved. If a smaller quantization parameter is selected by the second compression algorithm, the second quantization still results in the same reconstructed values as the first quantization and therefore no loss of data will be incurred during the second compression.

Predictive coding is not very efficient when there is little or no correlation between neighboring pixels. Therefore, a worst case quantization mode is designed to handle these cases. In the worst case quantization mode no prediction is used and the original samples are quantized and encoded using binary representation of the samples. The first bit in the header of the packet is set by the packer builder 140 to specify if the worst case quantization mode is used. In the worst case quantization mode 13 pixels are quantized and encoded using 6 bits and 7 pixels are quantized using 7 bits.

The coding logic 130 uses a combination of fixed length coding and Exp-Golomb coding similar to the coding logic 200 in FIG. 2. Exp-Golomb coding is used instead of Huffman code since it matches the probability distribution of the prediction errors. The fixed length codes assigns a fixed length code of size 7 bits to the 128 smallest prediction values for the first 7 samples and it assigns 6 bits to the 64 smallest prediction values for the next 13 samples. Since in encoder 100 the prediction errors are coded by the coding logic and the prediction errors have a Laplacian distribution for image signal, the highest probability values are the prediction errors that have the smallest absolute values (values close to zero). Therefore the fixed length code assigns codes to the prediction errors with the smallest absolute values.

If the coding logic 130 cannot use the fixed length coding logic 210 because at least one of the inputs is not from the set of high probability symbols the coding logic will use the Exp-Golomb code. Accordingly, the rate control logic 150 needs to determine if the fixed length coding can be used or not.

Finally the rate control logic 150 finds the smallest quantization parameter that can be used to encode the input samples using fewer than 128 bits If for a quantization parameter Exp-Golomb results in a bit count that is higher than 128 bits and fixed length cannot be used the rate control logic 150 increases the amount of quantization and encoding restarts. That is, the entire samples get requantized. The quantization step size will be sent to the decoder in the packet header via the packet builder 140.

Table 1 shows the comparison of using Exp-Golomb coding and the coding technique in the above image compression algorithm. As shown in the table our algorithm improves the PSNR values for all images and for all color components and the increase in PSNR can be significant for some images.

TABLE 1

Comparison of an embodiment with Exp-Golomb coding when used to encode prediction errors in the image compression algorithm shown above.

|  | Lena | Chinese_noisy | Boy | Clown | Kodak | Susie | Boats |
|---|---|---|---|---|---|---|---|
| PSNR for Exp-Golomb code | Y = 54.27 dB CB = 70.04 dB CR = 68.76 dB | Y = 50.64 dB CB = 51.24 dB CR = 49.66 dB | Y = 55.41 dB CB = 55.77 dB CR = 54.88 dB | Y = 52.01 dB CB = 50.88 dB CR = 50.82 dB | Y = 51.14 dB CB = 51.28 dB CR = 50.89 dB | Y = 64.46 dB CB = 65.15 dB CR = 64.83 dB | Y = 53.86 dB CB = 54.02 dB CR = 53.91 dB |
| PSNR for Exp-Golomb + fixed length code | Y = 57.81 dB CB = 85.92 dB CR = 86.79 dB | Y = 56.31 dB CB = 59.57 dB CR = 54.27 dB | Y = 57.47 dB CB = 57.45 dB CR = 56.98 dB | Y = 56.03 dB CB = 54.44 dB CR = 54.07 dB | Y = 52.97 dB CB = 53.19 dB CR = 52.87 dB | Y = 74.71 dB CB = 74.32 dB CR = 73.93 dB | Y = 55.89 dB CB = 56.00 dB CR = 56.14 dB |

Figure 4:
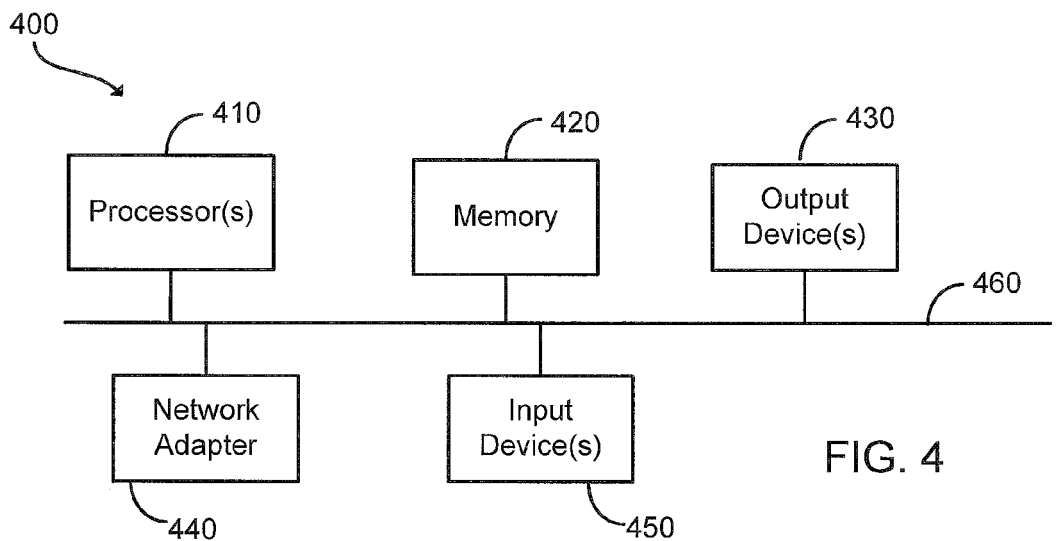
FIG. 4 is a high-level extent diagram showing an example of the architecture of the decoder and/or encoder.

FIG. 4 is a high-level extent diagram showing an example of the architecture of the decoder and/or encoder 100. The encoder 100 and/or the decoder can be implemented with architecture 400 shown in FIG. 4. The architecture 400 includes one or more processors 410 and memory 420 coupled to an interconnect 460. The interconnect 460 shown in FIG. 4 is an abstraction that represents any one or more separate physical buses, point-to-point connections, or both, connected by appropriate bridges, adapters, or controllers. The interconnect 460, therefore, may include, for example, a system bus, a form of Peripheral Component Interconnect (PCI) bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire", and/or any other suitable form of physical connection.

The processor(s) 410 is/are the central processing unit (CPU) of the architecture 400 and, thus, control the overall operation of the architecture 400. In certain embodiments, the processor(s) 410 accomplish this by executing software or firmware stored in memory 420. The processor(s) 410 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

The memory 420 is or includes the main memory of the architecture 400. The memory 420 represents any form of random access memory (RAM), read-only memory (ROM), flash memory, or the like, or a combination of such devices. In use, the memory 420 may contain, among other things, software or firmware code for use in implementing at least some of the embodiments of the invention introduced herein.

Also connected to the processor(s) 410 through the interconnect 460 is a communications interface 440, such as, but not limited to, a network adapter, one or more output device(s) 430 and one or more input device(s) 450. The network adapter 240 provides the architecture 200 with the ability to communicate with remote devices and may be, for example, an Ethernet adapter or Fibre Channel adapter. The input device 450 may include a touch screen, keyboard, and/or mouse, etc. The output device 430 may include a screen and/or speakers, etc.

The techniques introduced above can be implemented by programmable circuitry programmed/configured by software and/or firmware, or entirely by special-purpose circuitry, or by a combination of such forms. Such special-purpose circuitry (if any) can be in the form of, for example, one or more application-specific integrated circuits (ASICs), programmable logic devices (PLDs), field-programmable gate arrays (FPGAs), etc.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM); random access memory (RAM); magnetic disk storage media; optical storage media; flash memory devices; etc.), etc.

The term "logic", as used herein, means: a) special-purpose hardwired circuitry, such as one or more application-specific integrated circuits (ASICs), programmable logic devices (PLDs), field programmable gate arrays (FPGAs), or other similar device(s); b) programmable circuitry programmed with software and/or firmware, such as one or more programmed general-purpose microprocessors, digital signal processors (DSPs) and/or microcontrollers, or other similar device(s); or c) a combination of the forms mentioned in a) and b).

Figure 5:
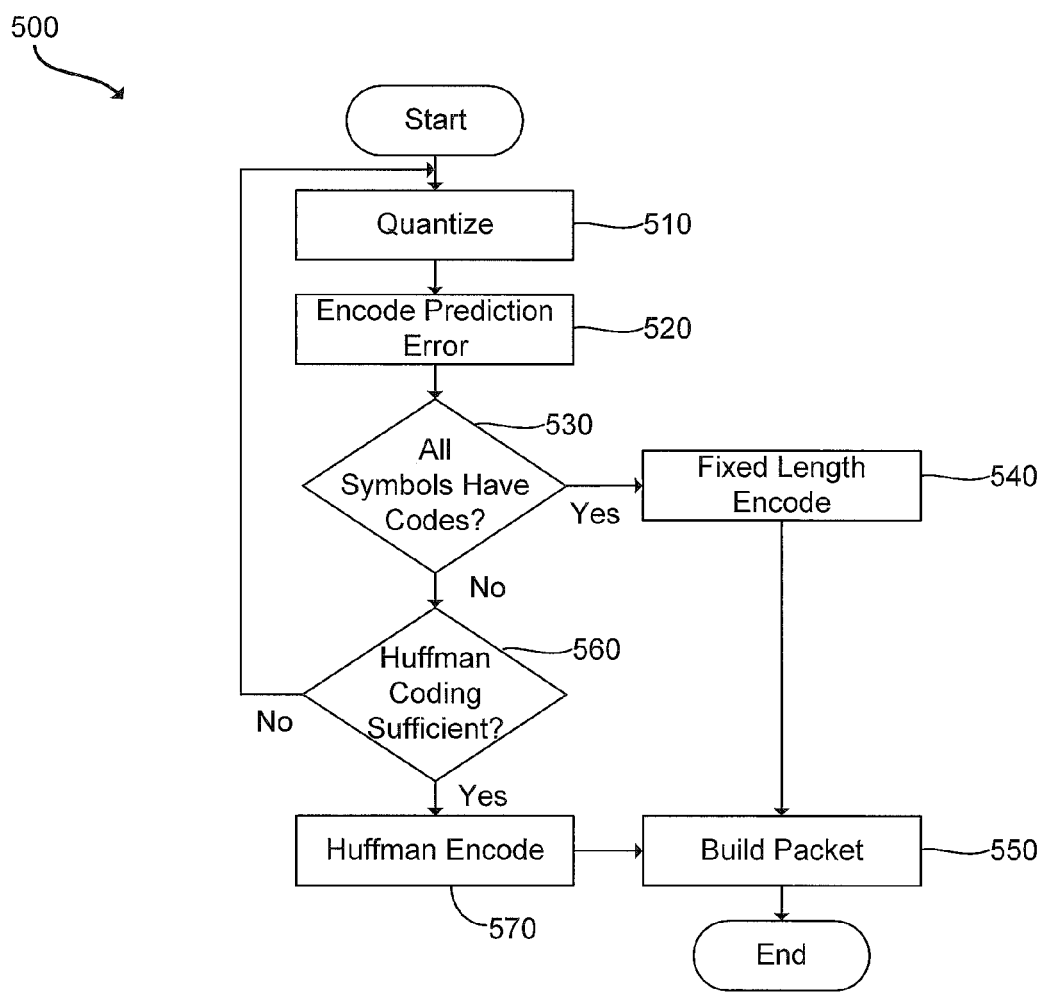
FIG. 5 illustrates a technique for image compression according to an embodiment of the invention.

FIG. 5 illustrates a technique 500 for image compression according to an embodiment of the invention. First, samples are quantized (510), prediction error is then found and encoded (520). If (530) all prediction errors have fixed length codes, then fixed length encoding is applied (540) and a packet is built (550) incorporating the coded prediction errors, coding mode, and quantization parameter. The technique 500 then ends. Otherwise, if (530) not all prediction errors have codes, if (560) Huffman coding results in a bit count that is less than or equal the bit count budget for each packet then the prediction errors are Huffman encoded (570) and a packet is built (550) and the technique 500 ends. If (560) Huffman coding is insufficient (i.e. it results in a bit count that is larger than the fixed bit count budget for each packet), then the technique 500 restarts with a larger quantization parameter (510).

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A fixed rata data encoder which compresses a fixed number of input samples into a fixed number of bits, comprising:
    a quantization logic configured to quantize a sample;
    a coding logic configured to receive and code the quantized sample, the coding logic including more than one coding logics, wherein
        a first coding logic includes an entropy coding;
        a second coding logic includes a coding logic that assigns shorter or equal length code words to symbols with a probability higher than other symbols and results in a higher bit rate than the entropy coding if used in a variable rate lossless coding of the samples if the probability distribution of the samples remains unchanged over time; and
    a packet builder, communicatively coupled to the coding logic, configured to build a packet with the encoded samples.

2. The encoder of claim 1, wherein the entropy coding logic includes a Huffman coding logic, an arithmetic coding logic, a universal coding logic, or a Golomb coding logic.

* * * * *